US010859641B2

(12) United States Patent
Petrashov et al.

(10) Patent No.: US 10,859,641 B2
(45) Date of Patent: *Dec. 8, 2020

(54) QUANTUM INTERFERENCE DEVICE, DEVICE INCORPORATING SAME, AND METHOD OF MANUFACTURING A QUANTUM INTERFERENCE DEVICE

(71) Applicant: Royal Holloway and Bedford New College, Egham (GB)

(72) Inventors: Victor Tikhonovich Petrashov, Egham (GB); Christopher Checkley, Selby (GB)

(73) Assignee: Royal Holloway and Bedford New College, Egham (GB)

( * ) Notice: Subject to any disclaimer, the term of this patent is extended or adjusted under 35 U.S.C. 154(b) by 149 days.

This patent is subject to a terminal disclaimer.

(21) Appl. No.: 15/756,515

(22) PCT Filed: Aug. 26, 2016

(86) PCT No.: PCT/GB2016/052664
§ 371 (c)(1),
(2) Date: Feb. 28, 2018

(87) PCT Pub. No.: WO2017/037436
PCT Pub. Date: Mar. 9, 2017

(65) Prior Publication Data
US 2018/0267115 A1 Sep. 20, 2018

(30) Foreign Application Priority Data
Sep. 3, 2015 (GB) .................................. 1515620.1

(51) Int. Cl.
*G01R 33/035* (2006.01)
(52) U.S. Cl.
CPC ....... *G01R 33/0354* (2013.01); *G01R 33/035* (2013.01)

(58) Field of Classification Search
CPC ...... H01B 13/00; H01B 13/106; H01B 12/00; H01B 1/00; G01R 33/3802;
(Continued)

(56) References Cited

U.S. PATENT DOCUMENTS 4,151,605 A * 4/1979 Faris ....................... G11C 11/44
257/31
4,843,504 A * 6/1989 Barnes ................ F16C 32/0438
310/10
(Continued)

FOREIGN PATENT DOCUMENTS

EP          0775917        5/1997
JP          H8-316536      11/1996
WO     WO 2012/007736     1/2012

OTHER PUBLICATIONS

Andreev, A. F., The Thermal Conductivity of the Intermediate State in Superconductors, Soviet Physics JETP, 19(5):1228-1231 (1964).
(Continued)

*Primary Examiner* — Vinh P Nguyen
(74) *Attorney, Agent, or Firm* — Cook Alex Ltd.

(57) ABSTRACT

A quantum interference device includes a superconducting loop interrupted by a normal conductor segment, and an interferometer connected to the normal conductor segment, wherein the superconducting loop includes a plurality of turns. The turns can be a plurality of adjacent lobes. A coil can be located within a lobe of the superconducting loop. Optionally, a bridge layer (e.g., of gold) is formed above the substrate to make an electrical contact between a superconducting layer (e.g., of niobium) formed above the bridge layer and a normal conducting layer (e.g., of titanium) formed above the bridge layer. The bridge layer allows the device to be formed of superconducting and normal con-
(Continued)

ducting material that are otherwise incompatible. A titanium normal conducting layer can be allowed to oxidize over a period of years.

9 Claims, 6 Drawing Sheets

(58) Field of Classification Search
 CPC .............. G01R 33/3815; G01R 13/342; G01R 29/0276; G01R 33/0356; G01R 33/0358; G01R 33/0017; G01R 33/035; G01R 33/0354; H03H 7/01; G11C 11/44; H01L 27/18; H01L 39/223; H01L 39/249; H01L 39/2493; G06N 10/00
 See application file for complete search history.

(56) References Cited

U.S. PATENT DOCUMENTS

| | | | | |
|---|---|---|---|---|
| 5,131,976 | A | * | 7/1992 | Hoko ................. H01L 27/18 216/3 |
| 5,326,986 | A | * | 7/1994 | Miller, Jr. ............ G01R 33/035 257/31 |
| 5,618,777 | A | * | 4/1997 | Hey-Shipton ............ H03H 7/03 505/210 |
| 2003/0111659 | A1 | | 6/2003 | Tzalenchuk et al. |
| 2006/0097747 | A1 | | 5/2006 | Amin |
| 2019/0195965 | A1 | * | 6/2019 | Petrashov ............ G01R 33/035 |

OTHER PUBLICATIONS

Beev, N. et al., Cryogenic time-domain multiplexer based on Squid arrays and superconducting/normal conducting switches, J. Physics: Conference Series, 507(4):42003 (May 12, 2014).

Checkley, C. et al., Andreev interferometers in a strong radio-frequency field, J. Physics: Condensed Matter, 23(13):135301 (Mar. 14, 2011).

Divencenzo, D. P., The Physical Implementation of Quantum Computation, Fortschritte der Physik 48: 771 (2000).

Giazotto, F. et al., Squipt-Superconducting Quantum Interference Proximity Transistor, Nature Physics 6(4):254-259 (Apr. 1, 2010).

Lupascu, A. et al., Quantum non-demolition measurement of a superconducting two-level system, Nature Physics. 3:119-125 (2007).

Petrashov, V. T. et al., Phase Controlled Conductance of Mesoscopic Structures with Superconducting "Mirrors", Physical Review Letters, 74(26):5268-5271 (Jun. 26, 1995).

Petrashov, V. T., Andreev Probe of Persistent Current States in Superconducting Quantum Circuits, Physical Review Letters, 95:147001 (2005).

Ryhanen, T. et al., Squid Magnetometers for Low-Frequency Applications, J. Low Temp. Phys. 76(5/6): pp. 287-386 (1989).

Schoelkopf, R. J. et al., Qubits as Spectrometers of Quantum Noise (2008).

International Search Report and Written Opinion, counterpart International Appl. No. PCT/GB2016/052664, dated Dec. 5, 2016.

* cited by examiner

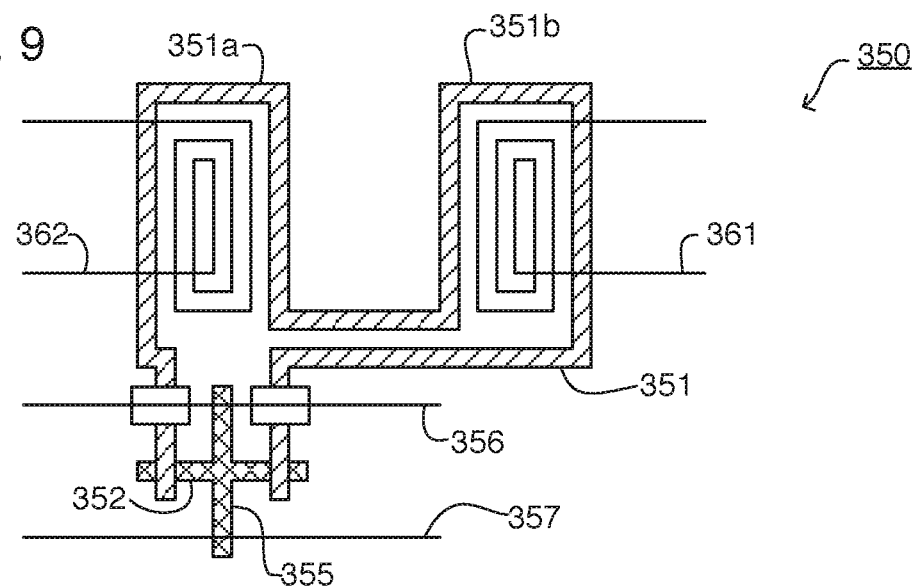
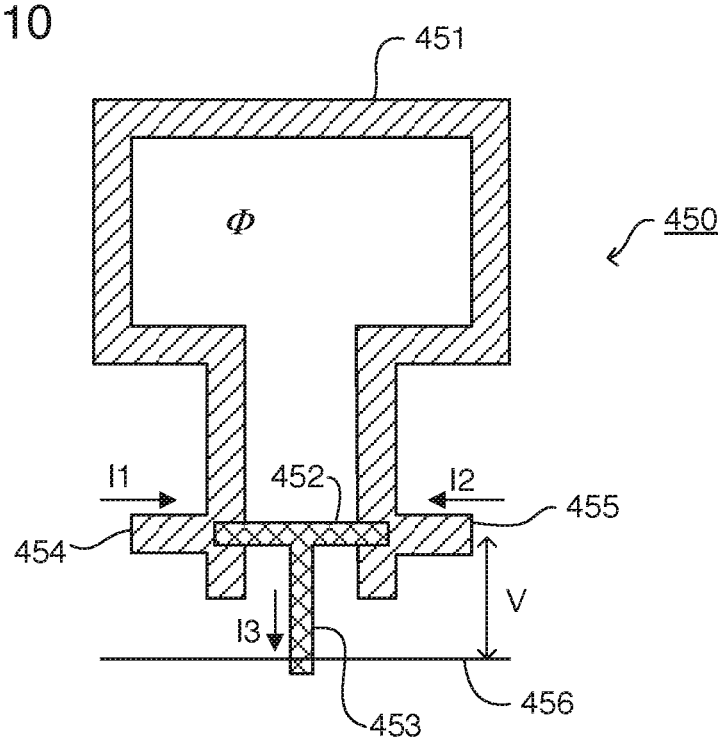

QUANTUM INTERFERENCE DEVICE, DEVICE INCORPORATING SAME, AND METHOD OF MANUFACTURING A QUANTUM INTERFERENCE DEVICE

The present invention relates to superconducting devices and to methods of manufacturing superconducting devices.

Various quantum interference devices—which can be used as flux sensors, transistors or qubits—are disclosed in WO 2012/007736 A1. Two examples of the devices are depicted in FIGS. 1 and 2 appended hereto.

In the device of FIG. 1, quantum interference devices 50 comprises a superconducting loop 51 interrupted by a normal conductor segment 52 which connects to the superconducting loop 51 at junctions 53, 54. A two branch 10 interferometer 55 is connected to the normal conductor segment 52. The two branches 55a, 55b are connected to the midpoint of the normal conductor segment 52 to form a cross.

A first branch 55a of the interferometer includes a barrier 56 separating the normal leads 57, 58 from the normal conductor segment 52. A second branch 55b of the interferometer comprises a normal spur 59 connecting to the normal conductor segment 52 and superconducting leads 60, 61. When a current is passed across the interferometer 55, quasiparticles are reflected from the normal:superconducting interfaces 53, 54 (Andreev reflection). The flux through the superconducting loop 51 affects the phase difference between interfaces 53 and 54 and hence causes quantum interference between the electrons reflected by the two boundaries. Therefore the current I across the interferometer 55 is sensitive to the flux $\Phi$.

In the variant of FIG. 2, extra current leads 62, 63 are provided to convert the interferometer to a transistor. The electrical conductance across the interferometer is controlled by the bias current $I_b$ in the superconducting wire.

WO 2012/007736 A1 teaches that the superconducting parts of such a device be made of aluminium (Al) or niobium (Nb). Al is advantageous as the natural oxidation of Al forms a passivation layer but Nb has a higher critical temperature Tc. The normal conducting parts of the device are suggested to be constructed of Magnesium (Mg), Antimony (Sb), Bismuth (Bi), carbon nanotubes or graphene.

SUMMARY OF THE INVENTION

It is an aim of the invention to provide improved quantum interference devices.

According to the present invention there is provided a quantum interference device comprising a superconducting loop interrupted by a normal conductor segment, and an interferometer connected to the normal conductor segment wherein the superconducting loop comprises a plurality of turns.

According to the present invention there is provided a quantum interference device comprising a superconducting loop interrupted by a normal conductor segment, and an interferometer connected the normal conductor segment; wherein the superconducting loop comprises two or more lobes.

BRIEF DESCRIPTION OF THE DRAWINGS

Exemplary embodiments of the present invention are described further below with reference to the accompanying drawings, in which:

FIG. 9 schematically depicts a quantum interference device according to an embodiment of the invention;

FIG. 10 schematically depicts a quantum interference device according to an embodiment of the invention;

In the various drawings, like parts are indicated by like references.

Figure 1:
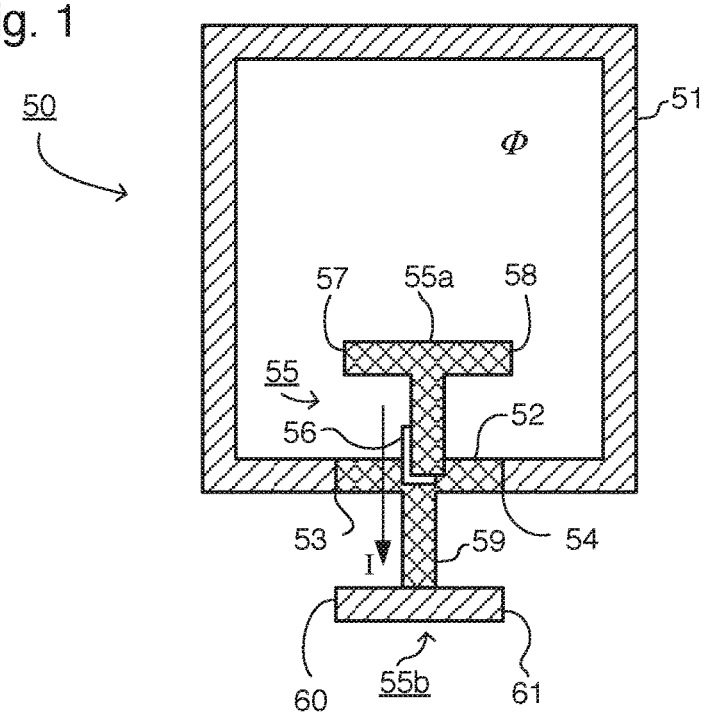
FIG. 1 depicts a quantum interference device known in the art.
Figure 2:
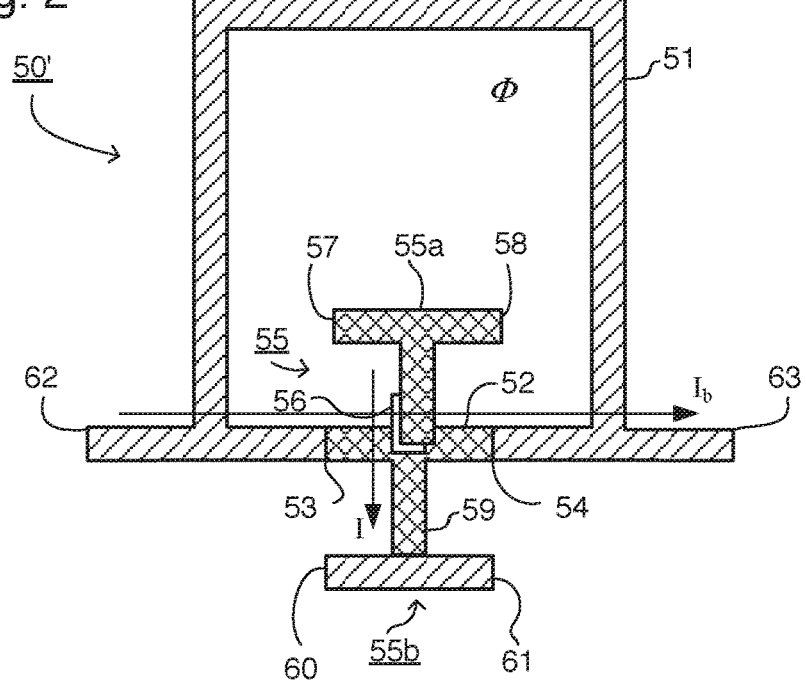
FIG. 2 depicts another quantum interference device known in the art.
Figure 3:
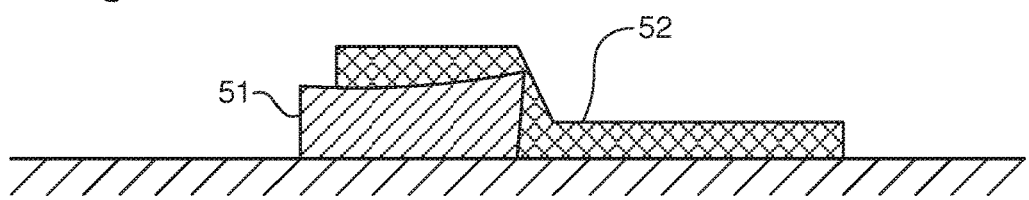
FIG. 3 depicts a problem occurring in manufacture of a quantum interference device known in the art.

The present inventor has determined that difficulties arise in reliably forming a junction between the normal and superconducting parts of a device such as those depicted in FIGS. 1 and 2. This can be explained with reference to FIG. 3, which depicts a junction between the superconducting loop 51 and normal conductor segment 52. The superconducting loop 51, e.g. made of niobium, is deposited onto a substrate first and then the normal conductor 52 is deposited to overlap. Candidate materials for the normal conductor segment 52 are aluminium (assuming operation at a temperature higher than 1.2 K) and antimony. Of these, aluminium is on the face of it preferable as it is relatively easy to work with and its self-limiting oxidation behaviour is useful to form a passivation layer. Antimony is a toxic material but has a higher resistivity than aluminium, which is useful as the figures of merit of the quantum interference device improve as the resistance of the normal segment increases. However, the present inventor has determined that it is difficult to form a reliable junction between an aluminium layer 52 and a niobium layer 51 when the aluminium layer is deposited on top of the niobium layer. It is not possible to reverse the order of layers because the native oxide layer, which forms on top of the aluminium layer very quickly on exposure to air, prevents electrical contact.

Figure 4:
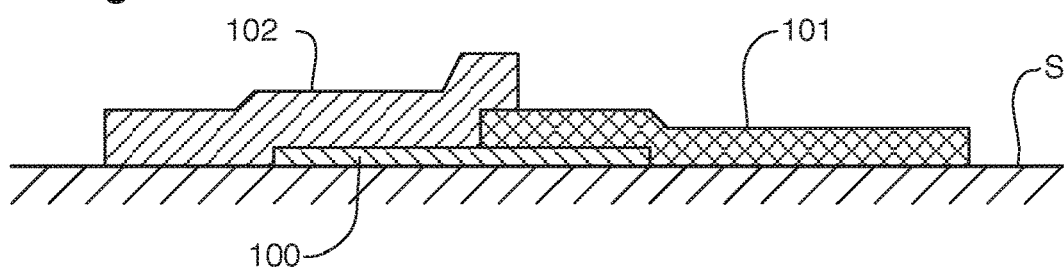
FIG. 4 depicts a junction between a superconductor and a normal conductor in an embodiment of the invention.

A junction according to an exemplary embodiment of the invention is depicted in cross-section in FIG. 4. On substrate S, a bridge layer 100 is provided in the region of the junction. Substrate S can be a standard silicon substrate. The bridge layer is desirably formed of a good conductor—such as gold (Au), silver (Ag) or copper (Cu) or alloys thereof—but does not have to be superconducting. Normal layer 101 is then deposited to overlap part, but not all of, bridge layer 100. Superconducting layer 102 is deposited to overlap at least part of the bridge layer that is not contacted by the normal layer 101. An electrical connection between the normal layer 101 and superconducting layer 102 is therefore made through the bridge layer 100.

Figure 5:
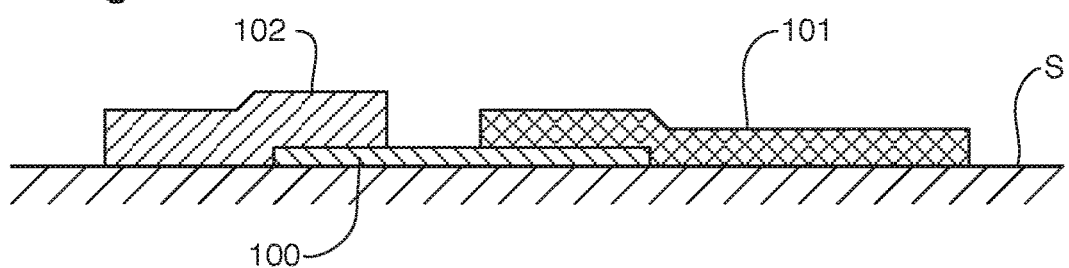
FIG. 5 depicts another junction between a superconductor and a normal conductor in an embodiment of the invention.

Superconducting layer 102 can overlap normal layer 101. Alternatively superconducting layer 102 can be separated from normal layer 101 so that there is no direct contact between them, as depicted in FIG. 5. Accordingly, the order of deposition of superconducting layer 102 and normal layer 101 is not constrained.

The bridge layer also increases the freedom of choice for materials for the superconducting layer 102 and normal layer 101. It is not necessary to consider the properties of an interface between the normal layer 101 and superconducting layer 102 since the electrical connection is made via the bridge layer 100. Instead, the compatibility of the bridge layer 100 with each of the normal layer 101 and superconducting layer 102 determines the properties of the junction.

Gold has been found by the present inventor to make good electrical connection to various superconducting materials, including niobium ($T_c$=9.26 K), lead ($T_c$=7.19 K) and aluminium ($T_c$=1.20 K). Likewise, gold has been found to make good electrical connection to materials suitable for use as the normal layer such as aluminium (at higher temperatures than 1.2 K), titanium (Ti), and alloys thereof. Since reliable connections can be formed, the present invention allows for a reduction in costs of manufacturing quantum interference devices. The improvement in yield more than makes up for the additional cost of the additional steps involved in forming the bridge layer.

Standard processing steps known for semiconductor manufacturing can be used to manufacture a quantum interference device according to an embodiment of the invention. E-beam lithography and photo-lithography can be used for patterning; the invention does not require especially high resolution patterning. Layers can be deposited by techniques such as sputtering and various vapour deposition techniques.

The present invention can be applied to a variety of different types of quantum interference devices, including SQUIDs, HyQUIDs, and Andreev interferometers. Quantum interference devices according to the invention can be used for various purposes, e.g. as magnetic field (or flux) sensors, transistors, qubits, or readout devices for qubits.

In an embodiment of the invention, at least some normal parts of the quantum interference device are made of titanium. Titanium has heretofore not been considered a suitable material for such uses as it is chemically active and oxidises in air, without forming a sealing layer preventing further oxidation in the way that aluminium does. Therefore, it would be expected that a titanium layer would completely oxidise in time, rendering any device relying on its conductivity non-functional.

However, a titanium oxide layer formed through oxidation of titanium in air does not in practice grow indefinitely. Rather the rate of growth slows and over a period of several years, likely about 4, the thickness of the titanium oxide layer stabilises at about 40 nm, having consumed a little less than that of the thickness of the original titanium layer. Therefore, by providing an initial titanium layer of thickness greater than the passivation depth of titanium, e.g. greater than 40 nm, it can be ensured that a conductive layer of non-oxidised titanium remains. In an embodiment the initial titanium layer has a thickness at least 20 nm greater than the passivation depth of titanium.

In a quantum interference device according to an embodiment of the invention, use of a titanium layer as a normal part interrupting a superconducting loop can provide an additional advantage. As the titanium layer oxidises, its resistance increases, increasing resistance of normal parts of the device. This improves operation of the device.

Figure 6:
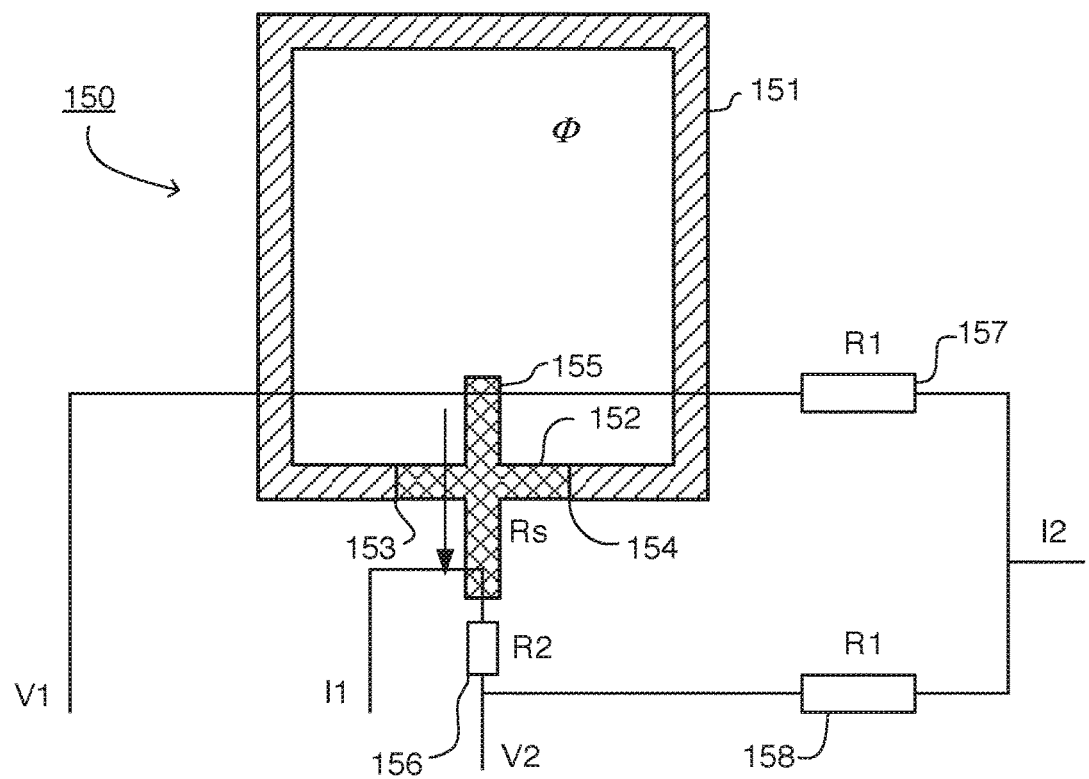
FIG. 6 schematically depicts a quantum interference device according to an embodiment of the invention.

An improved quantum interference device 150, e.g. useable as a flux sensor or magnetometer, is schematically depicted in FIG. 6. Quantum interference device 150 comprises a superconducting loop 151 interrupted by a normal conductor segment 152. The superconducting loop 151 and normal conductor segment 152 can be made of any of the respective superconducting and normal conducting materials discussed above. Normal: superconducting junctions 153, 154 are formed at the ends of the normal conductor segment 152. A crosspiece 155 is connected at the midpoint of normal conductor segment 152 so as to form an interferometer. Crosspiece 155 is desirably formed of the same material and at the same time as normal conductor segment 152. As discussed above, when a flux $\Phi$ is applied to the superconducting loop 151, quantum interference will occur between electrons reflected at the junctions 153, 154 so that the effective resistance of the crosspiece 155 is cyclically dependent on the flux $\Phi$ passing through superconductor loop 151.

A conventional approach to using a quantum interference device 150 to measure flux is to apply a known current through the crosspiece 155 and measure the resulting voltage across the crosspiece. As the flux $\Phi$ through the superconducting loop 151 changes, it causes a cyclic change in the resistance of the crosspiece, leading to a cyclic change in the voltage across the crosspiece at a fixed current through it. Since the resistance variation may be only a few percent of the total resistance of the crosspiece the cyclic voltage change that is superimposed on a non-oscillating voltage the relative amplitude of the quantum oscillations may be small as well. Therefore, the current fluctuations caused by changes in flux are difficult to measure, particularly in the case of small flux changes.

In the quantum interference device 150, the crosspiece 155 is placed in a Wheatstone bridge arrangement to enable direct measurement of the voltage change independently of the value of the non-oscillating voltage component. The Wheatstone bridge arrangement can be formed directly on the same substrate (i.e. on-chip) as the quantum interference device 150 so that the possibility of noise being picked up by long connecting leads can be avoided. Also, because the Wheatstone bridge is on-chip, it will be at a low temperature and so thermal noise is reduced substantially. A preamplifier can also be provided on the substrate adjacent the quantum interference device 150 to provide further noise immunity.

As depicted in FIG. 6, a resistor 156 is placed in series with the crosspiece 155. Resistor 156 has a resistance R2 that is equal to the nominal resistance Rs of the crosspiece 155. A series circuit of resistors 157, 158 is connected in parallel with the series circuit of crosspiece 155 and resistor 156. Resistors 157, 158 both have resistance R1. To measure, terminal V1 is connected to one end of crosspiece 155 and resistor 157. Terminal V2 is connected to the opposite end of resistor 156 and resistor 158. A sensor output is obtained by measuring the potential difference across terminals V1, V2 at a fixed bias current between terminal I1, connected to the junction between crosspiece 155 and resistor 156, and terminal I2, connected to the junction between resistors 157 and 158. To make relative changes in the current between I1 and I2 during measurements negligible the resistance R1 is made much greater than Rs.

Figure 7:
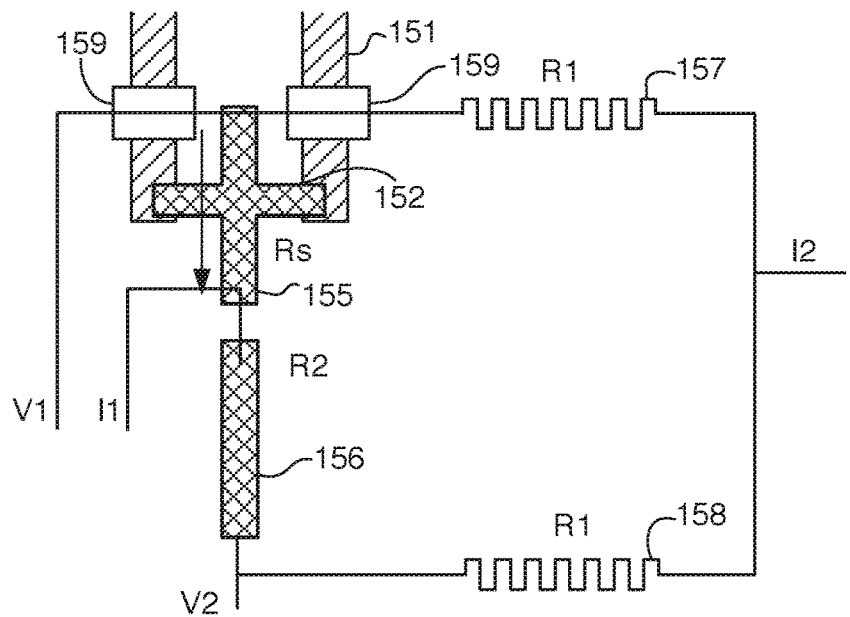
FIG. 7 is an enlarged view of a part of the quantum interference device of FIG. 6.

FIG. 7 depicts in greater detail how the circuit of FIG. 6 is effected on a substrate. Quantum interference device 150 can be formed by depositing the superconducting loop 151 and then overlaying the normal parts. Resistor 156 is desirably formed of the same material as the normal parts of the quantum interference device 150. It is desirably formed of the same material and has the same geometry as crosspiece 155 so as to have the same nominal resistance.

Insulating pads 159 are placed over the superconducting loop 151. Conductive traces can then be applied to join the inner end of crosspiece 155 to terminal V1 and to resistor 157. Resistor 157 and resistor 158 can be formed in the same step as the conductive traces by forming them as long meandering parts. The conductive traces forming resistors 152, 158 can have much more complex paths than those depicted in the Figure. Desirably, resistors 157 and 158 have the same dimensions and geometry and are formed in the same step to ensure that they have the same resistance. That their resistances are equal is more important than the exact value of their resistances.

Advantageously, resistors 156, 157 and 158 are formed from the same material and in close proximity to crosspiece 155. Therefore, any environmental variations, e.g. temperature changes, will affect the resistors equally as crosspiece 155 so that the relationships between their resistances remain constant. The Wheatstone bridge arrangement is possible with a hybrid quantum interference device because it is the resistance of the normal crosspiece that is being measured. With a conventional SQUID, the Wheatstone bridge arrangement would require a normal resistance having an equal resistance to the superconducting loop, which is impractical.

It is to be noted that the HyQUID of FIGS. 6 and 7, when used as a magnetometer, does not require the tunnelling barrier as used in the prior art. The HyQUID of FIGS. 6 and 7 can be fabricated using fewer steps than a magnetometer based on a SQUID.

Figure 8:
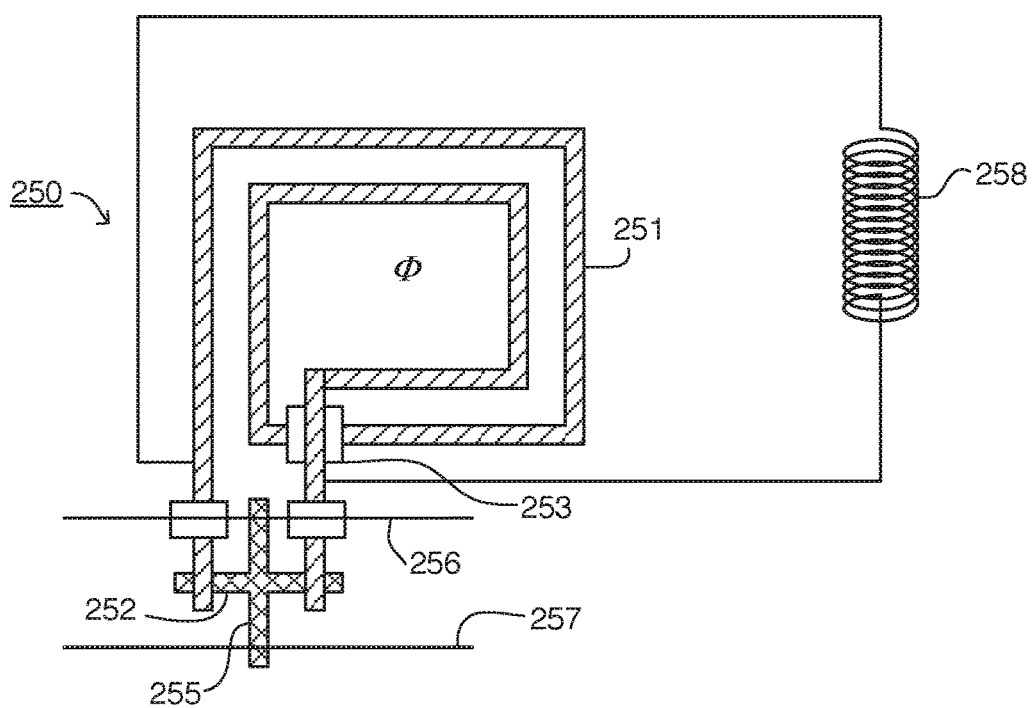
FIG. 8 schematically depicts a quantum interference device according to an embodiment of the invention.

Another improved quantum interference device 250 is schematically depicted in FIG. 8. Quantum interference device 250 is, for example, useable as a flux sensor or a magnetometer. Quantum interference device 250 includes a superconducting loop 251 interrupted by a normal conductor segment 252. A crosspiece 255 is connected to the middle of the normal conductor segment 252 in order to form an interferometer. Read-out leads 256, 257 are connected to the end of the crosspiece 255.

As shown in FIG. 8, superconducting loop 251 is provided in the form of a coil with multiple nested loops. In the Figure, only two loops are shown, but an embodiment can have as many loops as is required and/or can be accommodated in the available space. The loops can be concentric but need not be. The loops all surround a common area. Due to the increased flux linkage, the amplitude of the resistance oscillations induced by changing flux is approximately proportional to the number of loops of the superconducting loop 251, after correcting for differences in the area of each loop. An insulating pad 253 is provided to enable the superconducting loop 251 to cross over itself without electrical contact. By applying an insulating layer, it is also possible to stack superconducting loops vertically. A pickup coil 258, desirably also superconducting, can be connected to the superconducting loop 251 in order to enable measurement of magnetic fields at a remote location.

FIG. 9 schematically depicts another improved quantum interference device 350. Quantum interference device 350 comprises a superconducting loop 351 interrupted by a normal conductor segment 352. A crosspiece 355 is attached the midpoint of normal conductor segment 352 in order to form an interferometer. Read-out leads 356, 357 are connected to the ends of crosspiece 355. Superconducting loop 351 has two lobes 351a, 351b. The two lobes are adjacent to each other rather than overlapping or touching. They do not have to be directly adjacent nor close. The two lobes can be formed conveniently in the same layer of an integrated circuit. A pickup coil 362 can be provided in first lobe 351a. Pickup coil 362 allows for measuring the magnetic field at a remote location. A feedback coil 361 can be provided in second lobe 351b. Feedback coil 361 allows cancellation of magnetic fields, e.g. stray magnetic fields, and also to flux modulate the signal. Pickup coil 362 and feedback coil 361 are superconducting.

FIG. 10 depicts another improved quantum interference device 450. Both currents I1 and I2 flow in the direction 452 and converge at T-junction so I3=I1+I2). Quantum interference device 450 comprises a superconducting loop 451 interrupted by a normal conductor segment 452. Superconducting loop 451 is provided with terminals 454, 455 to which a bias current is applied in use. A normal conducting spur 453 is connected to the midpoint of normal conductor segment 452. By applying a potential difference V between a read-out lead 456 connected to the end of spur 453 and superconducting terminal 455, a current I3 flows through normal conductor spur 453. Because of quantum interference in the normal conductor segment 452, current I3 includes a cyclic component dependent on changes in flux Φ passing through superconducting loop 451.

The normal conductor segment 452 and normal conductor spur 453 form a T-shaped interferometer. This arrangement can be formed in fewer steps than a cross-shaped interferometer which requires connections to a branch of the interferometer within the superconducting loop.

Figure 11:
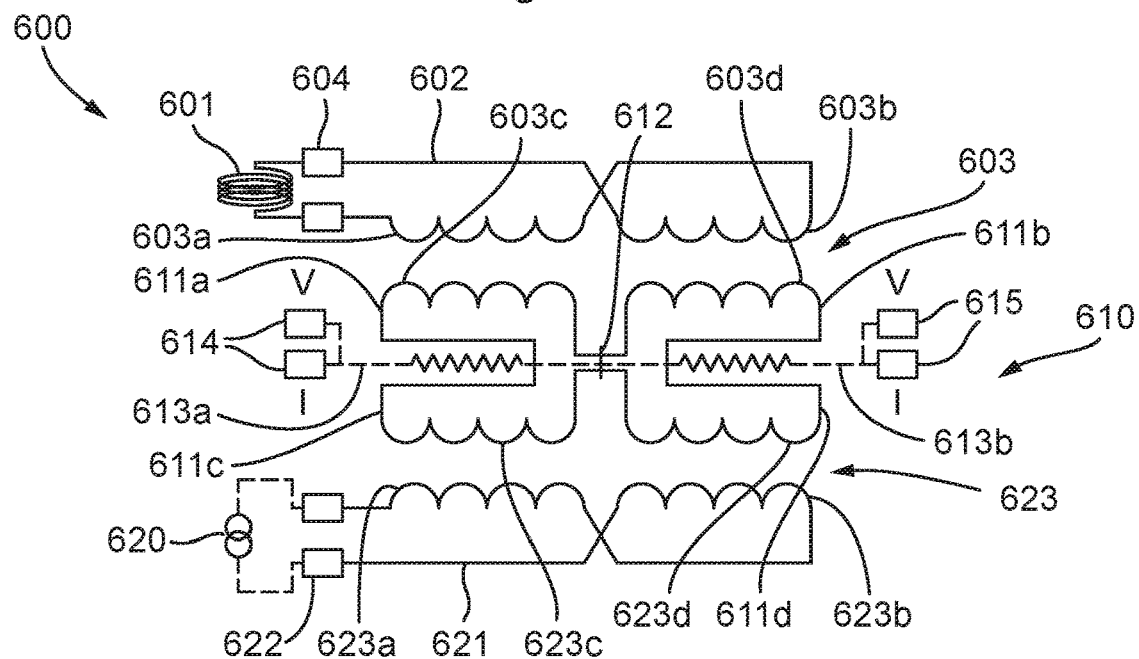
FIG. 11 schematically depicts a gradiometer including quantum interference devices according to an embodiment of the invention.

FIG. 11 depicts a gradiometer 600 using a four-lobed HyQUID 610 according to an embodiment of the invention. In FIG. 11, superconducting conductors are indicated by solid lines and normal conductors are depicted by dashed lines. The gradiometer also comprises a pick-up circuit and a feedback circuit which couple to the HyQUID by respective flux transformers.

The pick-up circuit comprises a pick-up coil 601 is connected via superconducting pick-up leads 602 to the pick-up side of a superconducting flux transformer 603. The pick up side of flux transformer 603 has two superconducting coil sections 603a, 603b which are connected so that the current induced by pick-up coil 601 flows in opposite senses in coil sections 603a, 603b. Connections between the pick-up coil 601 and superconducting pick-up leads 602 can be made via on-chip contact pads 604. The pick-up coil 601 and any connecting leads are superconducting.

The feedback circuit mirrors the pick-up circuit and allows a controlled flux to be applied to the HyQUID 610 so as to modulate the measurement signal or adjust the measurement range. A feedback current source 620 is connected to superconducting feedback leads 621 via on-chip contact pads 622. Feedback leads 621 are connected to feedback flux transformer 623. Specifically, feedback leads 621 are connected to coil sections 623a, 623b of feedback flux transformer 623 so that current flows in opposite senses in coil sections 623a, 623b.

HyQUID 610 comprises four superconducting lobes 611a-d connected symmetrically around an interferometer 612. Lobes 611a-d are adjacent rather than overlapping or touching but do not need to be close together. The arrangement of lobes is like a four-leafed clover with the interferometer at the centre. The lobes may be rectangular or rounded. The four-lobed HyQUID can be regarded as two two-lobed HyQUIDs sharing a normal segment.

Two of the lobes 611a, 611b include respective superconducting sections 603c, 603b which couple to a respective one of coil sections 603a, 603b of the pick-up flux transformer 603. Another two of the lobes 611c, 611d couple with coil sections 623a and 623b respectively of feedback flux transformer 623. To cancel the stray magnetic fields the total magnetic flux through the left-hand part of the gradiometer, 611a, 611c, must be equal to the total magnetic flux through the right-hand-hand part of the gradiometer, 611b, 611d (FIG. 11).

Figure 12:
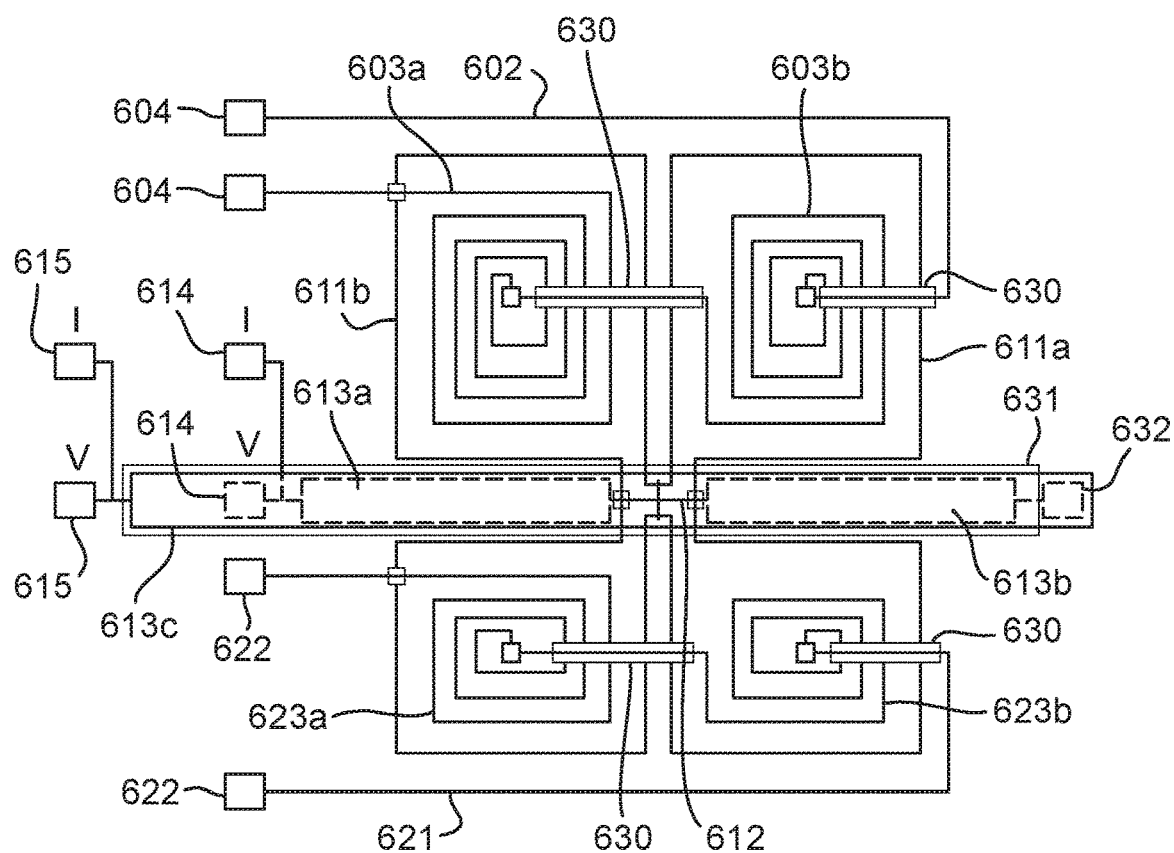
FIG. 12 depicts an on-chip arrangement of a gradiometer including quantum interference devices according to an embodiment of the invention.

Interferometer 612 is formed of a normal conductor and has the shape of a cross. Normal read-out leads 613a,b terminating in contact pads 614, 615 allow a current I to be applied across the cross-piece of the interferometer 612. Potential difference V is measured to provide the output signal. Desirably, read-out leads 613 have a low resistance. FIG. 12 shows in more detail how the gradiometer of FIG. 11 can be laid out on an integrated circuit using a minimum number of layers. Insulating pads 630 are provided to allow pick-up leads 602 and feedback leads 621 to cross the lobes of HyQUID 610 so as to connect with the respective coil sections of the flux transformers 603, 623. To maximise inductive coupling, the flux transformers are formed by spiral coils connected to the pick-up leads and feedback leads respectively and located within the lobes of the HyQUID 610.

Read-out leads 613a,b are formed as broad tracks in order to minimise their resistance. One readout lead 613b is folded back over the top of the other read-out lead 613b, with an elongate insulating pad 631 in between. This arrangement makes the area enclosed within current leads negligible. This minimises inductive coupling of readout wires to the flux-sensitive loops and pick-up of interference.

Figure 13:
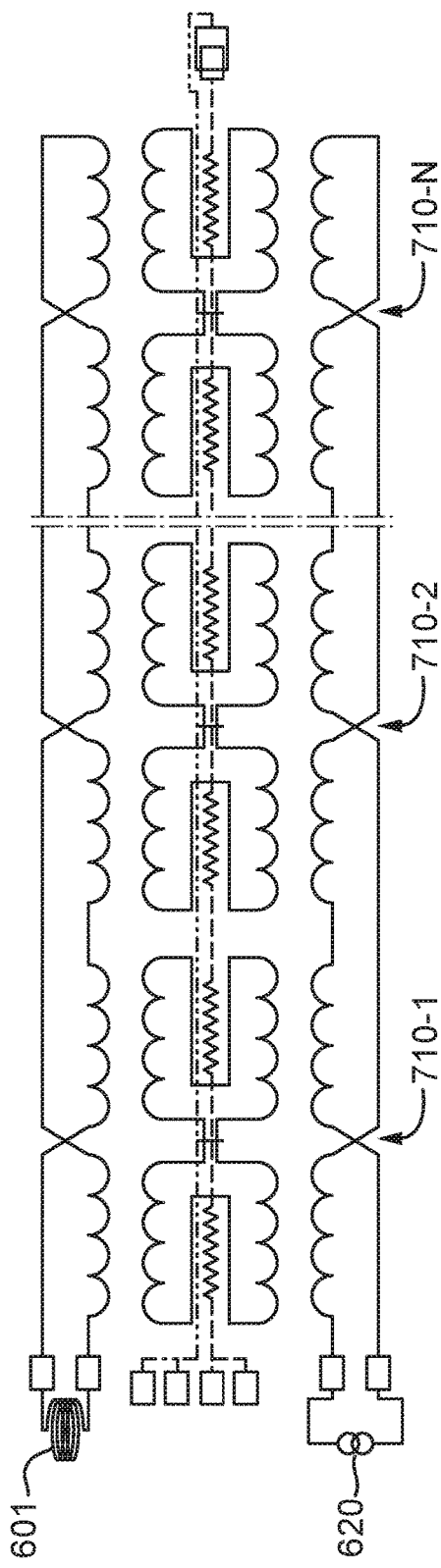
FIG. 13 schematically depicts a gradiometer including multiple quantum interference devices according to an embodiment of the invention.
Figure 14:
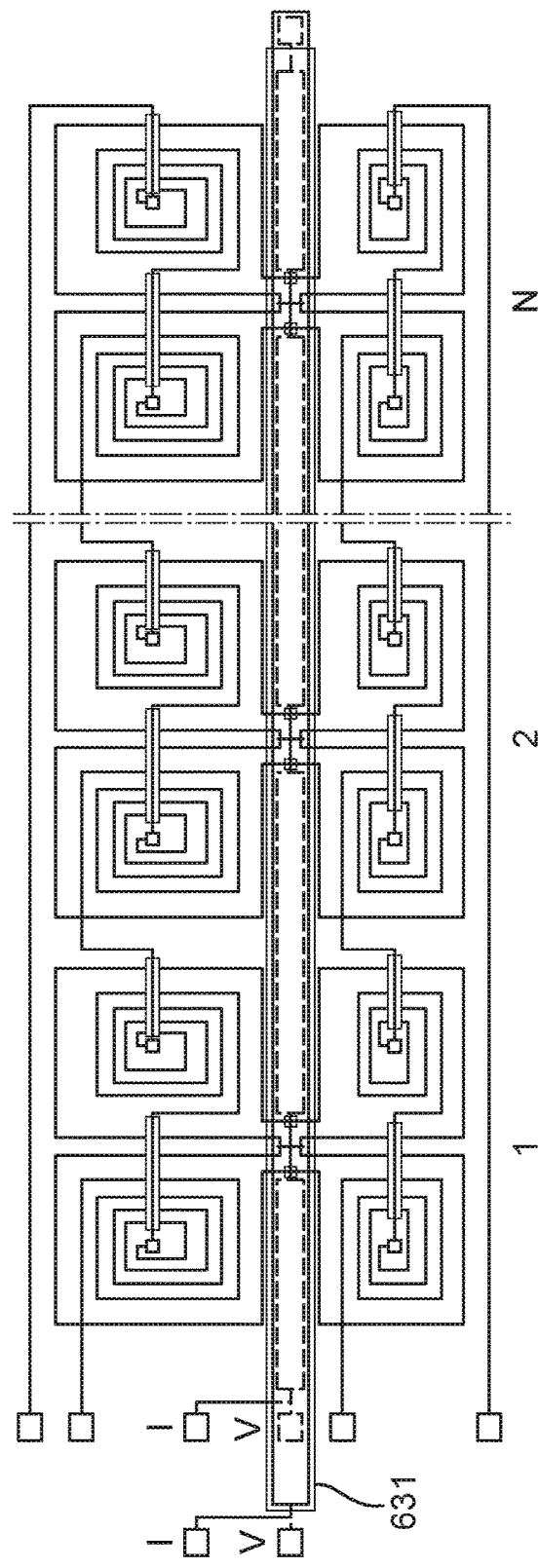
FIG. 14 depicts an on-chip arrangement of a gradiometer device including multiple quantum interference devices according to an embodiment of the invention.

FIGS. 13 and 14 are respectively schematic and chip layouts for a multi-stage gradiometer 700. Each gradiometer stage 710-1 to 710-N is equivalent of the gradiometer 600 of FIGS. 11 and 12. The pick-up coil 601 is connected each of the pick-up side flux transformers in series. Similarly the feedback current source 620 is connected in series to each of the feedback side flux transformers. The interferometers of the gradiometer stages are connected in series so that their resistances add, hence summing the signal measured from the pick-up coil. The total inductive coupling between spiral coils and interferometer loops increases proportionally to the number of gradiometer stages. The thermal magnetic flux noise is inversely proportional to the square root of the number of stages and decreases with that number. Again, one readout lead is folded back over the other to minimise the enclosed area and hence minimise the inductive coupling of the readout wires to the flux-sensitive loops and induced noise due to interference.

Embodiments of the invention include:

A) A superconducting device comprising: a substrate; a bridge layer formed above the substrate; a superconducting layer formed above the bridge layer and in direct electrical contact with a part of the bridge layer; and a normal conducting layer formed above the bridge layer and in direct electrical contact with a part of the bridge layer. This embodiment can provide an improved approach to forming junctions between superconductors and normal conductors.

B) A superconducting device according to embodiment A wherein the bridge layer is formed from a metal selected from the group consisting of: gold, silver, copper and alloys thereof.

C) A superconducting device according to embodiment A or B wherein the superconducting layer is formed from a metal selected from the group consisting of: niobium, lead, aluminium and alloys thereof.

D) A superconducting device according to embodiment A, B or C wherein the normal conducting layer is formed from a metal selected from the group consisting of: titanium, aluminium and alloys thereof.

E) A superconducting device according to embodiment D wherein the normal conducting layer is formed from a layer of titanium having a thickness greater than the passivation depth of titanium when manufactured, desirably greater than 20 nm plus the passivation depth of titanium, for example 40 nm.

F) A superconducting device according to embodiment D wherein the normal conducting layer is formed from a layer of titanium having a layer of titanium oxide thereon, the layer of titanium oxide having a thickness less than or equal to 40 nm.

G) A quantum interference device comprising a superconducting device according to any one of the preceding embodiments wherein the superconducting layer forms a loop and the normal conducting layer interrupts the loop; and further comprising an interferometer connected to the normal conducting layer.

H) A method of manufacturing a superconducting device comprising the steps of: forming a bridge layer above the substrate; forming a superconducting layer above the bridge layer and in direct electrical contact with a part of the bridge layer; and forming a normal conductor layer above the bridge layer and in direct electrical contact with a part of the bridge layer.

I) A method according to embodiment H wherein the superconducting layer is formed before the normal conducting layer.

J) A method according to embodiment H wherein the superconducting layer is formed after the normal conducting layer.

K) A method according to embodiment H, I or J wherein the bridge layer is formed from a metal selected from the group consisting of: gold, silver, copper and alloys thereof.

L) A method according to embodiment H, I, J or K wherein the superconducting layer is formed from a metal selected from the group consisting of: niobium, lead, aluminium and alloys thereof.

M) A method according to any one of embodiments H to L wherein the normal conducting layer is formed from a metal selected from the group consisting of: titanium, aluminium and alloys thereof.

N) A method according to any one of embodiments H to M wherein the normal conducting layer is formed from a layer of titanium having a thickness greater than 40 nm when manufactured.

O) A method according to embodiment N further comprising allowing the layer of titanium to oxidise.

P) A quantum interference device comprising a superconducting loop interrupted by a normal conductor segment wherein the normal conductor segment is formed from a layer of titanium having a thickness greater than the passivation depth of titanium when manufactured, desirably greater than 20 nm plus the passivation depth of titanium, for example 40 nm.

Q) A quantum interference device according to embodiment P further comprising an interferometer connected to the normal conductor segment and formed from a layer of titanium having a thickness greater than the passivation depth of titanium when manufactured, desirably greater than 20 nm plus the passivation depth of titanium, for example 40 nm.

R) A quantum interference device comprising a superconducting loop interrupted by a normal conductor segment, and an interferometer connected to the normal conductor segment; wherein the interferometer comprises one arm of a Wheatstone bridge.

S) A quantum interference device according to embodiment R wherein the Wheatstone bridge is formed on the same substrate as the quantum interference device.

T) A quantum interference device according to embodiment S wherein the Wheatstone bridge comprises a first resistor formed in series with the interferometer and having the same nominal resistance as the interferometer and second and third resistors forming a series circuit in parallel with the series circuit comprising the first resistor and the interferometer.

U) A quantum interference device according to embodiment T wherein the second and third resistors have the same nominal resistance, the nominal resistance of the second and third resistors being greater than the nominal resistance of the interferometer and the first resistor.

V) A quantum interference device according to embodiment U or T wherein the second and third resistors are each formed by a meandering conductive trace.

W) A quantum interference device comprising a superconducting loop interrupted by a normal conductor segment, a normal spur connected to the normal conductor segment and current terminals connected to the superconducting loop opposite the ends of the normal conductor segment.

Having described exemplary embodiments of the present invention it will be appreciated that variations on the described embodiments can be made. For example, although the bridge layer is shown as formed directly on a substrate it can be formed on other layers, e.g. an insulator. Features of the different devices described above can be combined in all feasible combinations. The present invention is not to be limited by the above description but rather by the appended claims.

The present invention claims priority from British Patent application GB1515620.1 filed 3 Sep. 2015, which document is hereby incorporated by reference.

The invention claimed is:

1. A quantum interference device comprising a superconducting loop interrupted by a normal conductor segment, and an interferometer connected to the normal conductor segment wherein the superconducting loop comprises a plurality of turns, wherein the plurality of turns comprises a plurality of nested loops.

2. A quantum interference device according to claim 1 wherein the plurality of turns comprises a plurality of adjacent lobes.

3. A quantum interference device according to claim 2 further comprising a coil located within a lobe of the superconducting loop.

4. A quantum interference device according to claim 3 having two lobes and a coil located within each lobe of the superconducting loop.

5. A device according to claim 1 further comprising a bridge layer at a junction between a superconductor and a normal conductor.

6. A device according to claim 5 wherein the bridge layer is formed from a metal selected from the group consisting of: gold, silver copper and alloys thereof.

7. A device according to claim 1 wherein the superconducting loop is formed from a metal selected from the group consisting of: niobium, lead, aluminium and alloys thereof.

8. A device according to claim 1 wherein the normal conductor segment is formed from a metal selected from the group consisting of: titanium, aluminium and alloys thereof.

9. A device according to claim 8 wherein the normal conductor segment is formed from a layer of titanium having a thickness greater than 40 nm.

\* \* \* \* \*